(12) United States Patent
Funda et al.

(10) Patent No.: US 8,836,190 B2
(45) Date of Patent: Sep. 16, 2014

(54) MAGNETIC BEARING, A ROTARY STAGE, AND A REFLECTIVE ELECTRON BEAM LITHOGRAPHY APPARATUS

(75) Inventors: Sahin Funda, Eindhoven (NL); Krijn Frederik Bustraan, Eindhoven (NL); Olav Seijger, Eindhoven (NL); Justus Bjorn Post, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 380 days.

(21) Appl. No.: 13/265,676

(22) PCT Filed: Apr. 14, 2010

(86) PCT No.: PCT/IB2010/051598
§ 371 (c)(1),
(2), (4) Date: Oct. 21, 2011

(87) PCT Pub. No.: WO2010/122450
PCT Pub. Date: Oct. 28, 2010

(65) Prior Publication Data
US 2012/0038233 A1    Feb. 16, 2012

(30) Foreign Application Priority Data

Apr. 23, 2009  (EP) .................................. 09158613

(51) Int. Cl.
*H02K 7/09* (2006.01)
*F16C 32/04* (2006.01)
*H01J 37/20* (2006.01)

(52) U.S. Cl.
CPC ....... *H01J 37/20* (2013.01); *H01J 2237/20257* (2013.01); *F16C 32/0468* (2013.01); *F16C 32/0489* (2013.01)
USPC ......................................... 310/90.5; 310/181

(58) Field of Classification Search
CPC ... H02K 7/09; F16C 32/0442; F16C 32/0444; F16C 39/063; F16C 32/0465
USPC ................................................. 310/90.5, 181
See application file for complete search history.

(56) References Cited

U.S. PATENT DOCUMENTS 6,191,513 B1  2/2001  Chen et al.
6,355,994 B1  3/2002  Andeen et al.
(Continued)

FOREIGN PATENT DOCUMENTS

EP    1411255 A1    4/2004
GB    2246401 A     1/1992
(Continued)

OTHER PUBLICATIONS

Petric et al: "Rebl: A Novel Approach to High Speed Maskless Electron Beam Direct Write Lithography"; J. Vac. Sci. Technology B, vol. 27 (1), Jan./Feb. 2009, pp. 161-166.

(Continued)

*Primary Examiner* — Tran Nguyen
*Assistant Examiner* — Alex W Mok

(57) ABSTRACT

A magnetic bearing (108) with an axis of rotation (106), wherein the magnetic bearing comprises: a cylindrical rotor (116) comprising a ferromagnetic material (118, 338, 440) wherein the cylindrical rotor has an axis of symmetry (114), wherein the cylindrical rotor has an inner radius (124), wherein the cylindrical rotor has a top side (128), a static hub (120), wherein the static hub has an overhang (122) which protrudes from the static hub and is located adjacent to the top side, a lift magnetic actuator apparatus (130) for controlling the distance (126) between the top side and the overhang, a radial magnetic actuator apparatus (132) for controlling the distance (136) between the inner radius and the axis of rotation.

16 Claims, 14 Drawing Sheets

(56) References Cited

U.S. PATENT DOCUMENTS

| | | | |
|---|---|---|---|
| 6,617,722 B2 | 9/2003 | Ooyama et al. | |
| 6,700,259 B1 | 3/2004 | Lin et al. | |
| 6,885,121 B2 * | 4/2005 | Okada et al. | 310/90.5 |
| 6,927,517 B2 * | 8/2005 | Brunet et al. | 310/90.5 |
| 2002/0002816 A1 * | 1/2002 | Coenen | 57/404 |
| 2002/0153790 A1 | 10/2002 | Kanebako et al. | |
| 2003/0057784 A1 | 3/2003 | Kanebako | |
| 2006/0163962 A1 * | 7/2006 | Shimada | 310/90.5 |
| 2008/0073993 A1 * | 3/2008 | Sortore et al. | 310/90.5 |
| 2008/0122308 A1 * | 5/2008 | Mleux | 310/90.5 |
| 2008/0174119 A1 * | 7/2008 | Hu | 290/55 |
| 2008/0252161 A1 * | 10/2008 | Kubo | 310/90.5 |
| 2008/0315812 A1 * | 12/2008 | Balboul | 318/430 |
| 2009/0039740 A1 * | 2/2009 | Sortore et al. | 310/68 B |
| 2009/0121571 A1 * | 5/2009 | Onuma | 310/90.5 |

FOREIGN PATENT DOCUMENTS

| | | |
|---|---|---|
| JP | 58184319 A | 10/1983 |
| JP | 59219521 A | 12/1984 |
| JP | 07208470 A | 8/1995 |
| WO | 03003385 A2 | 1/2003 |

OTHER PUBLICATIONS

Kim et al: "High-Precision Magnetic Levitation Stage for Photolithography"; Precision Engineering, vol. 22, pp. 66-77, 1998.

Lebedev et al: "Analysis and Initial Synthesis of a Novel Linear Actuator With Active Magnetic Suspension"; Industry Applications Conference, 2004, 39th IAS Annual Meeting. vol. 3, Oct. 2004, pp. 2111-2118.

* cited by examiner

US 8,836,190 B2

MAGNETIC BEARING, A ROTARY STAGE, AND A REFLECTIVE ELECTRON BEAM LITHOGRAPHY APPARATUS

FIELD OF THE INVENTION

The invention relates to the design of magnetic bearings, in particular it relates to the design of rotational stages for electron beam lithography and for electron beam metrology.

BACKGROUND OF THE INVENTION

Magnetic bearings are bearings that use magnetic force to support a rotor. The advantage of using a magnetic bearing is that there are no mechanical parts to wear out. A disadvantage of magnetic bearings is that they require electrical current to levitate the rotor. At high speeds, eddy currents in the rotor due to different portions of the rotor passing through the magnetic fields of the magnetic actuators can lead to an energy loss.

U.S. Pat. No. 6,191,513 B1 discloses the use of silicon steel laminations to reduce eddy currents that result in power loss due to heating caused by magnetic hysteresis and to a delay in the control of response magnets.

In wafer inspection devices and for electron beam lithography systems for the semiconductor industry commonly use linear stages. However, the time required to scan a wafer with a linear stage is a limit on the wafer throughput for these systems. In the *Journal of Vacuum Science and Technology B* volume 27, pages 161 through 166 an article by Paul Petric, Chris Bevis, Allen Carroll, Henry Percy, Marek Zywno, Keith Stanford, Alan Brodie, Boah Bareket, and Luca Gralla (hereafter referred to as Petric), a Reflective Electron Beam Lithography (REBL) system is disclosed. It discloses the use of a rotary stage for multiple silicon wafers.

SUMMARY OF THE INVENTION

The invention provides for a magnetic bearing, a rotary stage, a reflective electron beam lithography apparatus, a magnetic actuator, and a cylindrical rotor in the independent claims. Embodiments of the invention are given in the dependent claims.

Embodiments of the invention address the aforementioned problems by the use of ferromagnetic materials in the rotor which reduce the eddy currents. In one embodiment, soft magnetic composite iron is used in the cylindrical rotor. In another embodiment, ferromagnetic laminates such as silicon steel are used to limit the eddy currents.

A disadvantage of using laminations to construct the cylindrical rotor is that at higher speeds so called lamination noise can be produced. Lamination noise is due to laminations being suddenly exposed to a large magnetic field. Lamination noise is defined herein as being the noise emitted by ferromagnetic laminations when exposed to stepwise magnetic field changes. A familiar example of lamination noise is the hum produced by some transformers. The hum can be due to the vibrations of wires, but it can also be caused by vibrations of the ferromagnetic plates used to construct the transformer. Lamination noise in a rotary stage for lithography or metrology is not desirable. It can cause small acoustical vibrations in the stage, which could interfere with the lithography process or the metrology.

Embodiments of the invention address the problem of lamination noise by adjusting the orientation of the laminations and/or the orientation of the magnetic actuators so that as the bearing rotates the magnetic field does not increase uniformly across each lamination. In one embodiment of the invention, corners and edges of ferromagnetic materials that comprise the actuators and are adjacent to the cylindrical rotor are rounded. This makes the magnetic field increase less abruptly and also reduces the lamination noise.

An embodiment of the invention reduces the amount of electrical energy required to operate the magnetic bearing by using a permanent magnet to support or partially support the cylindrical rotor against the force of gravity.

Embodiments of the invention provide for a magnetic bearing with an axis of rotation. The magnetic bearing comprises a cylindrical rotor comprising a ferromagnetic material. The cylindrical rotor has an axis of symmetry, and the cylindrical rotor has an inner radius. The cylindrical rotor has a topside. Since the magnetic bearing has an axis of rotation, it is understood that this magnetic bearing functions in a gravitational field. The magnetic bearing further comprises a static hub. The static hub has an overhang which protrudes from the static hub and is located adjacent to the topside. The topside of the cylindrical rotor is on top as defined by the gravitational field. The magnetic bearing further comprises a lift magnetic actuator apparatus for controlling the distance between the first surface and the overhang. The lift magnetic actuator can comprise permanent magnets, electromagnets, or a combination of electro and permanent magnets. The magnetic bearing further comprises a radial magnetic actuator apparatus for controlling the distance between the inner radius and the axis of rotation. The radial magnetic actuator apparatus can also comprise permanent magnets, electromagnets, or a combination of electromagnets and permanent magnets.

This arrangement is advantageous, because the magnetic bearing has a cylindrical rotor which is able to hang from the static hub. The cylindrical rotor comprises ferromagnetic materials and does not contain any magnets. In some embodiments, the lift magnetic actuator is able to support the cylindrical rotor against the force of gravity, and it also stabilizes the rotation of the cylindrical rotor by preventing it from wobbling.

The lift magnetic actuators control the distance between the first surface and the overhang, and they also align the axis of rotation and the axis of symmetry in the same direction. The radial magnetic actuator apparatus aligns the axis of symmetry and the axis of rotation so that they are coaxial. Depending upon the embodiment the axis of rotation and the axis of symmetry can deviate slightly. If the axis of rotation is horizontal, then the radial magnetic actuators may be used to lift the cylindrical rotor.

The cylindrical rotor behaves much like a gyroscope. The mass of the cylindrical rotor and any structure which is connected to the rotor and rotating with it has a moment of rotational inertia. If there are small vibrations or disturbances, the rotational inertia will have a tendency to reduce the amount of movement in the cylindrical rotor. This means that the bearing will be very useful for providing a stable stage for such applications as electron beam lithography or electron beam metrology.

In another embodiment, the lift magnetic actuator apparatus comprises at least one permanent magnet capable of supporting the cylindrical rotor against the gravitational force. This embodiment is advantageous, because the at least one permanent magnet supports the cylindrical rotor, so therefore less power is needed for the electromagnets to support the rotor. This reduces the electrical power needed to operate the magnetic bearing.

In another embodiment, the axis of rotation is a vertical axis of rotation. The vertical axis of rotation is aligned with gravity.

In another embodiment, the axis of rotation is a horizontal axis of rotation.

In another embodiment, the radial magnetic actuator apparatus and/or the lift magnetic actuator apparatus comprises at least one hybrid magnet. The hybrid magnet comprises a ferromagnetic core. The ferromagnetic core has two slots cut in it such that the cross section is E-shaped. There is a middle section between the two slots, and the middle section has an outer surface whose normal points away from the ferromagnetic core. The hybrid magnet further comprises a coil of wire adapted for generating a magnetic field when a current is passed through the wire. The coil is located within the two slots and around the middle section. The hybrid magnet further comprises a permanent magnet which is placed on the outer surface. The magnetization of the permanent magnet is aligned with the normal of the outer surface. This embodiment is advantageous, because the permanent magnet is able to provide a portion of magnetic field needed to levitate the cylindrical rotor. The electromagnet is then able to either strengthen or weaken the magnetic field of the permanent magnet.

In another embodiment, the ferromagnetic material comprises a soft magnetic composite in order to reduce the eddy currents during the rotation of the cylindrical rotor. The use of a soft magnetic composite is beneficial because eddy currents create losses and a damping force that opposes the rotation of the bearing.

In another embodiment, the ferromagnetic material comprises Somaloy in order to reduce eddy current stream rotation. Somaloy is a type of a soft magnetic composite. The benefits of using a soft magnetic composite have already been discussed.

In another embodiment, the ferromagnetic material comprises ferromagnetic laminations for reducing eddy currents during the rotation of the magnetic bearing. The laminations are stacked in a circular path about the axis of symmetry to construct a cylindrical volume. The use of laminations has the benefit that the eddy currents are reduced.

In another embodiment, there is a plane in which the axis of symmetry lies for each of the laminations. Each of the laminations has a first transverse axis, and each of the laminations is arranged such that it is rotated out of the plane about its first transverse axis by a first angle that is between 0 and 60 degrees, preferably between 0.1 and 15 degrees. The measure of angle is given in absolute terms. The first angle can be either negative or positive. This embodiment is advantageous, because having the laminations at a slight angle with respect to the leading edge of the magnetic field of the radial magnetic actuator apparatus allows the lamination noise to be reduced. Being located on the radial plane of the cylindrical rotor, in many embodiments it is not easy to tilt the radial magnetic actuator. By rotating the laminations by the first angle, the radial magnetic actuator does not need to be rotated.

In another embodiment, there is a plane in which the axis of symmetry lies. Each of the laminations has a longitudinal first axis wherein each of the laminations is arranged such that it is rotated out of the plane about its first longitudinal axis by a second angle between 0 and 60 degrees, preferably between 0.1 and 15 degrees. The measure of angle is given in absolute terms. The second angle can be either negative or positive. Rotating these laminations about the longitudinal axis is beneficial, because the laminations can then have a slight angle with respect to the magnetic field of the lift magnetic actuator apparatus. This has the same benefit as was noted when the laminations are rotated by the first angle.

In another embodiment, the laminations are rotated about both the first angle and the second angle. In this embodiment the laminations have the angle controlled with respect to both the lift magnetic actuator apparatus and the radial magnetic actuator apparatus.

In another embodiment, the lift actuator apparatus comprises at least one first hybrid magnet. The first hybrid magnet has a second longitudinal axis and a second transverse axis, and there is a radius that intersects both the longitudinal axis and the second transverse axis. The second transverse axis encloses a third angle between 0 and 60 degrees with the radius, preferably between 0.1 and 15 degrees. The measure of angle is given in absolute terms. The third angle can be either negative or positive. This embodiment is advantageous because the orientation of the ferromagnetic laminations with respect to the lift magnetic actuator apparatus can be adjusted for the purpose of reducing lamination noise.

In another embodiment, the lift radial apparatus comprises at least one second hybrid magnet (132, 542, 1399). The longitudinal axis and a plane orthogonal to the axis of rotation enclose a fourth angle between 0 and 60 degrees with the radius, preferably between 0.1 and 15 degrees. This embodiment is advantageous, because the orientation of the ferromagnetic laminations with respect to the radial magnetic actuator apparatus can be adjusted for the purpose of reducing lamination noise.

In another embodiment, the lift magnetic actuator apparatus and/or radial magnetic actuator apparatus comprises at least one ferromagnetic core. The ferromagnetic core has two or more second surfaces whose normal forms an acute angle with a tangent of a circular path about the axis rotation wherein at least one edge of at least one second surface is rounded to reduce lamination noise. This embodiment is advantageous, because it removes a corner which is adjacent to the cylindrical rotor. Having the sharp edge of a ferromagnetic core makes the magnetic field smoother and thus reduces the lamination noise.

In another embodiment, the magnetic bearing further comprises a radial sensor system for measuring the distance of the inner radius with respect to the rotational axis. The magnetic bearing further comprises a lift sensor for measuring the distance between the first surface and the overhang. The magnetic bearing further comprises a control system adapted for receiving signals from the lift sensor and for controlling the lift magnetic actuator apparatus such that a first predetermined distance between the first surface and the overhang is maintained. The control system is further adapted for receiving signals from the axial sensor system and for controlling the axial magnetic actuator apparatus such that a second predetermined distance between the inner radius and the axis of rotation is maintained.

In another aspect, the invention provides for a rotary stage. The rotary stage comprises a magnetic bearing according to an embodiment of the invention. The rotary stage further comprises a drive system adapted for rotating the magnetic bearing. The rotary stage comprises a platter adapted for holding at least one workpiece. The platter is driven by a cylindrical motor. The rotary stage further comprises an encoder for determining the angle of orientation of the magnetic bearing. This embodiment is advantageous, because such a rotary stage can be used for electron beam lithography and also for electron beam metrology equipment. Such a rotary stage can be used for other applications where stable rotary motion is necessary such as for a flywheel for energy storage.

In another embodiment, the lift magnetic actuator apparatus comprises at least one permanent magnet capable of supporting the cylindrical rotor and the platter against the gravitational force. This embodiment has the same benefit as was discussed previously for the magnetic bearing alone.

In another aspect, the invention provides for a reflective electron beam lithography apparatus comprising a rotary stage according to an embodiment of the invention. The design and use of reflective electron beam lithography apparatuses are described in Petric.

In another aspect, the invention provides for a magnetic actuator for controlling the distance between the cylindrical rotor and a static hub in the magnetic bearing. The magnetic actuator comprises a ferromagnetic core and the ferromagnetic core has a leading surface and a trailing surface which has one or more rounded edges for reducing lamination noise. The benefits of this embodiment have been previously discussed.

In another aspect, the invention provides for a cylindrical rotor comprising a ferromagnetic material. The cylindrical rotor has an axis of symmetry and the ferromagnetic material comprises ferromagnetic laminations for reducing eddy currents during rotation of the cylindrical rotor. The laminations are stacked in a circular path about the axis of symmetry to construct a cylindrical volume. There is a plane in which the axis of symmetry lies for each of the laminations, and each of the laminations has a first transverse axis (1182). Each of the laminations is arranged such that it is rotated out of the plane about its first transverse axis by a first angle (1184) between 0 and 60 degrees, preferably between 0.1 and 15 degrees.

BRIEF DESCRIPTION OF THE DRAWINGS

In the following preferred embodiments of the invention will be described, by way of example only, and with reference to the drawings in which.

DETAILED DESCRIPTION

Like numbered elements in these Figures are either identical elements or perform the same function. Elements which have been discussed previously will not necessarily be discussed in later Figures if the function is identical.

Figure 1:
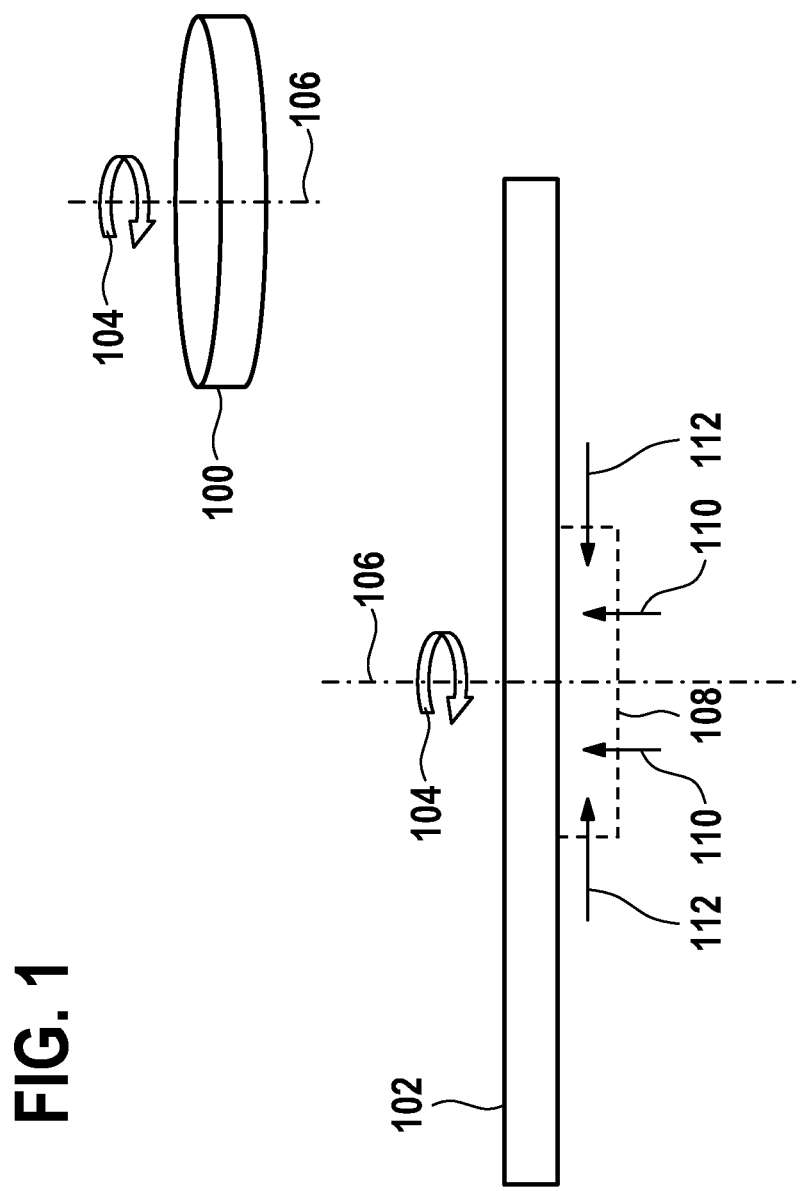
FIG. 1 shows a functional diagram of an embodiment of the invention.

FIG. 1 shows a diagram that demonstrates the concept of embodiments of the invention. There is a perspective view of a rotational disc 100 and a side view 102 of the same rotational disc. The disc rotates about an axis of rotation 106. There is a magnetic bearing 108 that supports the rotational disc 100, 102. The arrows labeled 112 indicate stabilization due to a radial magnetic actuator apparatus, and arrows indicated 110 show stabilization and lift due to lift magnetic actuator apparatus. Some embodiments of the invention support the disc 102, 100 and the magnetic bearing 108 against the force of gravity. The arrow 104 shows the direction of rotation.

Key features of this embodiment are:

The disk 100, 102 in FIG. 1 is rotated with an electromotor. In one embodiment, the stationary part of the motor (stator) magnetically interacts with its rotor which is build in with the rotational disk. There is no mechanical bearing system coupling rotor and the stator. In an alternative embodiment, there is a mechanical drive system which turns the magnet bearing.

In the axial direction, magnetic levitation is required against gravity. These axial magnetic levitation units (or lift magnetic actuator apparatus) are also actively controlled to stabilize the air gaps in the magnetic bearing.

In radial direction, the magnetic levitation units (or radial magnetic actuator apparatus) hold the rotating disk in position. The radial magnetic levitation units supply a static preload and control the distance actively. In one embodiment the static preload is supplied with a permanent magnet.

Figure 2:
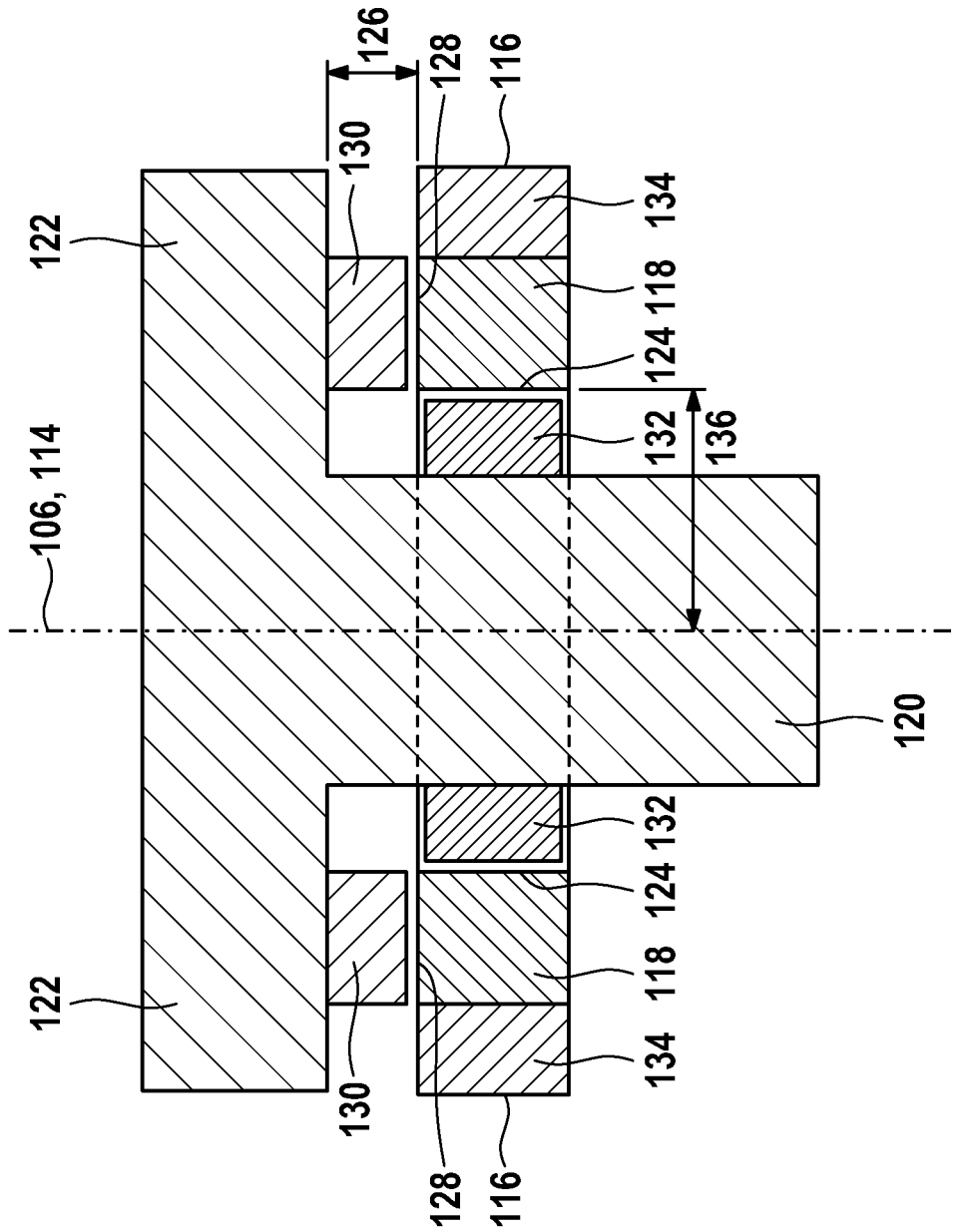
FIG. 2 shows a cross sectional view of an embodiment of a magnetic bearing according to the invention.

FIG. 2 shows a cross-sectional side view of an embodiment of a magnetic bearing according to the invention. There is a static hub 120, and there is the axis of rotation 106. There is an overhang 122 which extends out of the static hub 120. There is a cylindrical rotor 116 which is adapted for rotation about the axis of rotation 106. The cylindrical rotor 116 has an axis of symmetry 114. During operation the axis of symmetry 114 and the axis of rotation 106 may be aligned. The cylindrical rotor 116 comprises an outer collar 134 and a ferromagnetic material 118. The ferromagnetic material has a topside 128 which is adjacent to the lift magnetic actuator apparatus 130. The lift magnetic actuator apparatus 130 is connected to the overhang 122. The lift magnetic actuator apparatus can support the cylindrical rotor 116 against the force of gravity. The lift magnetic actuator 130 also controls the distance between the first side 128 and the overhang 122. This is indicated by the distance 126 in the diagram. There is a radial magnetic actuator apparatus 132 which controls the distance between the inner radius 124 and the axis of rotation 106. The distance is indicated by arrow 136 in the diagram.

Figure 3:
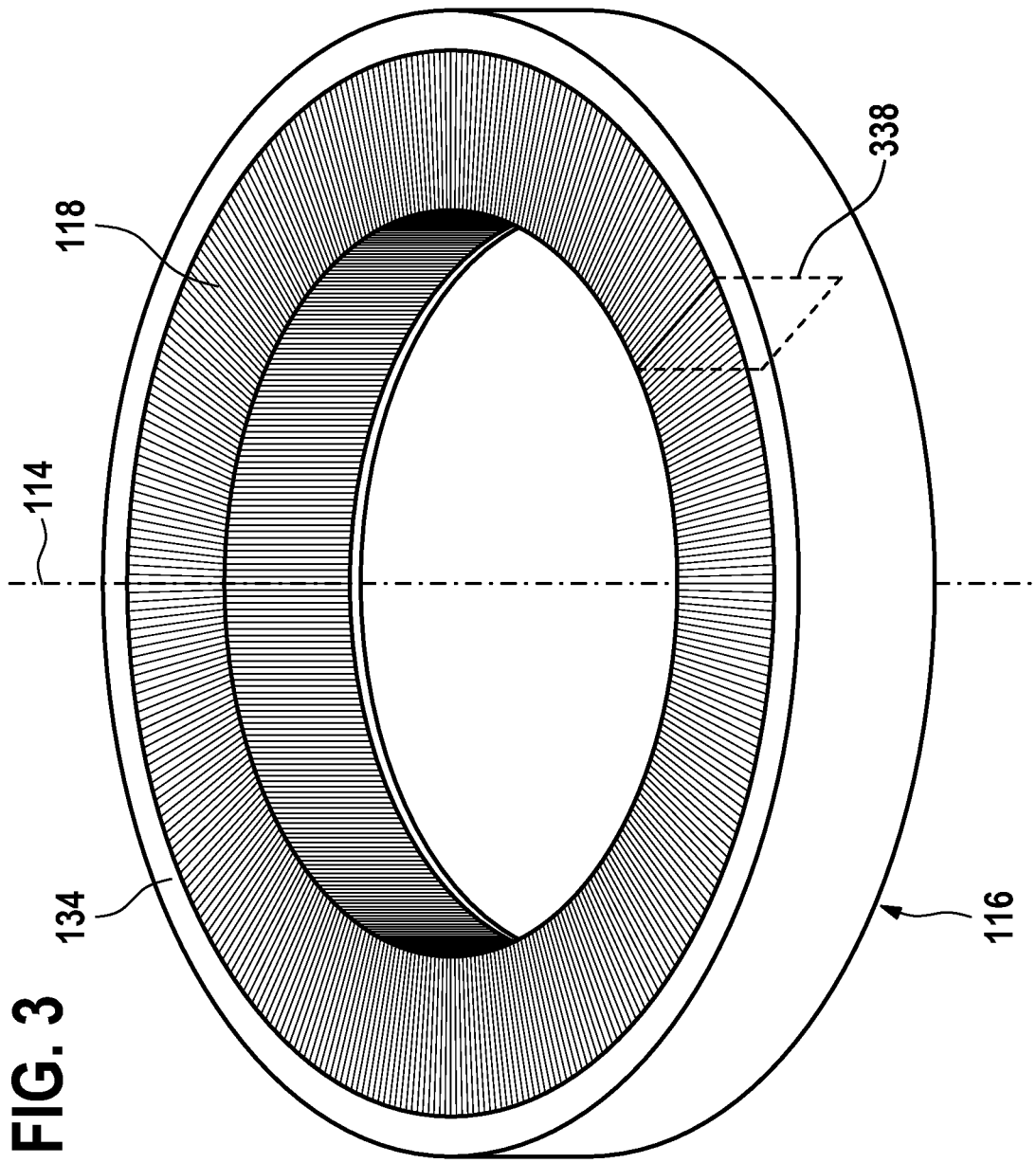
FIG. 3 shows a perspective view of a cylindrical rotor according to an embodiment of the invention.

FIG. 3 shows an embodiment of a cylindrical rotor 116. As can be seen in the Figure, this rotor is symmetric with respect to an axis of symmetry 114. There is a collar 134 which surrounds a cylinder of ferromagnetic material 118. The ferromagnetic material 118 in this embodiment is comprised of individual ferromagnetic laminations 338. The position of one ferromagnetic lamination is shown by a rectangle labeled 338 in the Figure.

Figure 4:
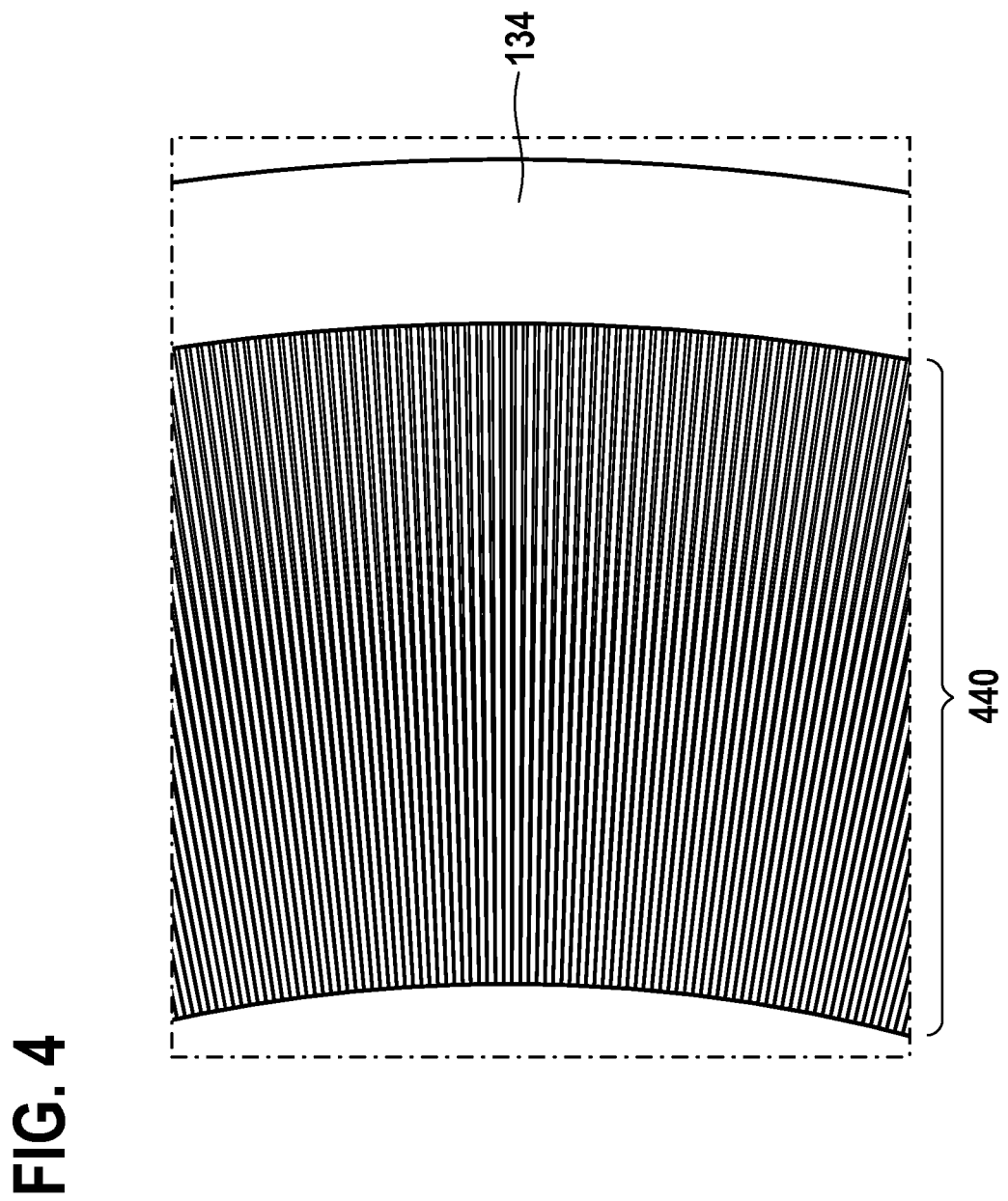
FIG. 4 shows a close up, top view of a portion of a cylindrical rotor according to an embodiment of the invention.

FIG. 4 shows a close up side view of a section of the cylindrical rotor shown in FIG. 3. Again there is a collar 134. In FIG. 4, we can see that the ferromagnetic material is comprised of a stack of ferromagnetic laminations 440.

Figure 5:
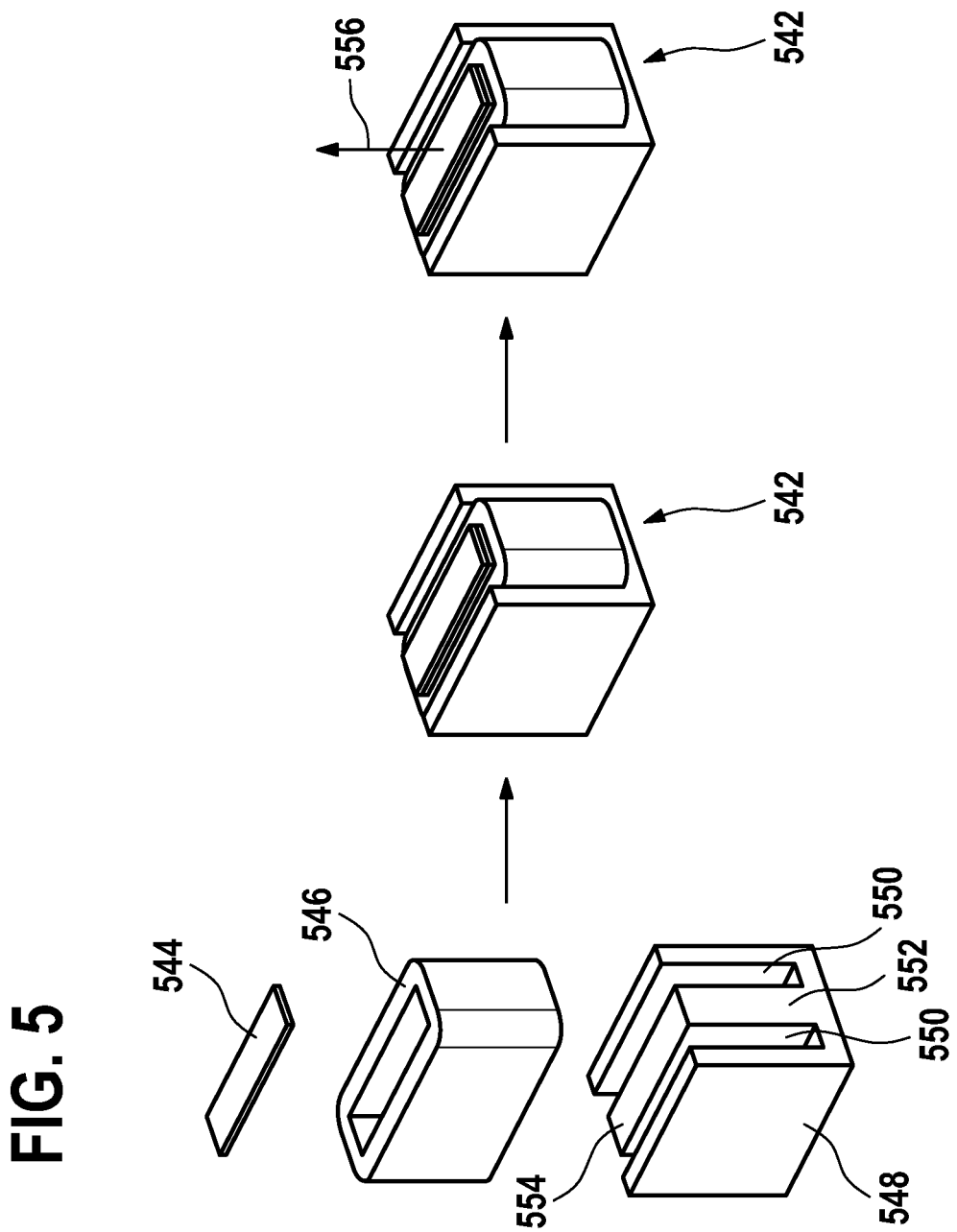
FIG. 5 shows an assembly drawing of a hybrid magnet according to an embodiment of the invention.

FIG. 5 shows an embodiment of a hybrid magnet 542. The hybrid magnet 542 is constructed from a permanent magnet 544, a coil 546 and a ferromagnetic core 548. The ferromagnetic core 548 has two slots 550. There is a middle section 552 which has an outer surface 554. The coil 546 fits into the two slots 550 and is located around the middle section 552. The permanent magnet 544 is then attached to the outer surface 554. The arrow 556 indicates the direction normal to the outer surface 554 and is also located in the same direction as the magnetization produced by the hybrid magnet 542.

Figure 6:
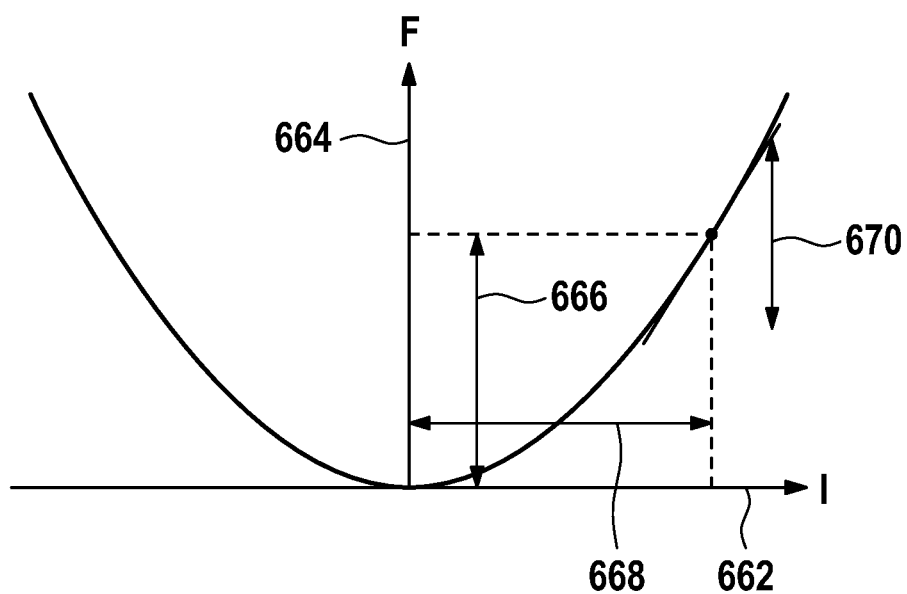
FIG. 6 shows an illustration that demonstrates the benefit of using a hybrid magnet according to an embodiment of the invention.

FIG. 6 shows a diagram which illustrates the benefit of using a hybrid magnet which comprises a permanent magnet. In this diagram the force 664 of attraction of a cylindrical rotor to an electromagnetic is shown. The force 664 between the hybrid magnet and the cylindrical rotor is proportional to the square of the current through the coil and inversely proportional to the square of the gap between the two. Axis 664 indicates the force and axis 662 indicates the current of electromagnet. Force 666 is the force necessary to lift the cylindrical rotor. In order to lift the cylindrical rotor a force is necessary. However, this can be supplied by a permanent magnet. 668 shows the amount current that can be replaced by a permanent magnet. The permanent magnet lifts the rotor and the electromagnet is only necessary to increase or decrease the force in order to adjust the position of the cylindrical rotor relative to the overhang. Arrow 670 indicates how force of the magnet can be varied by the electromagnet.

Figure 7:
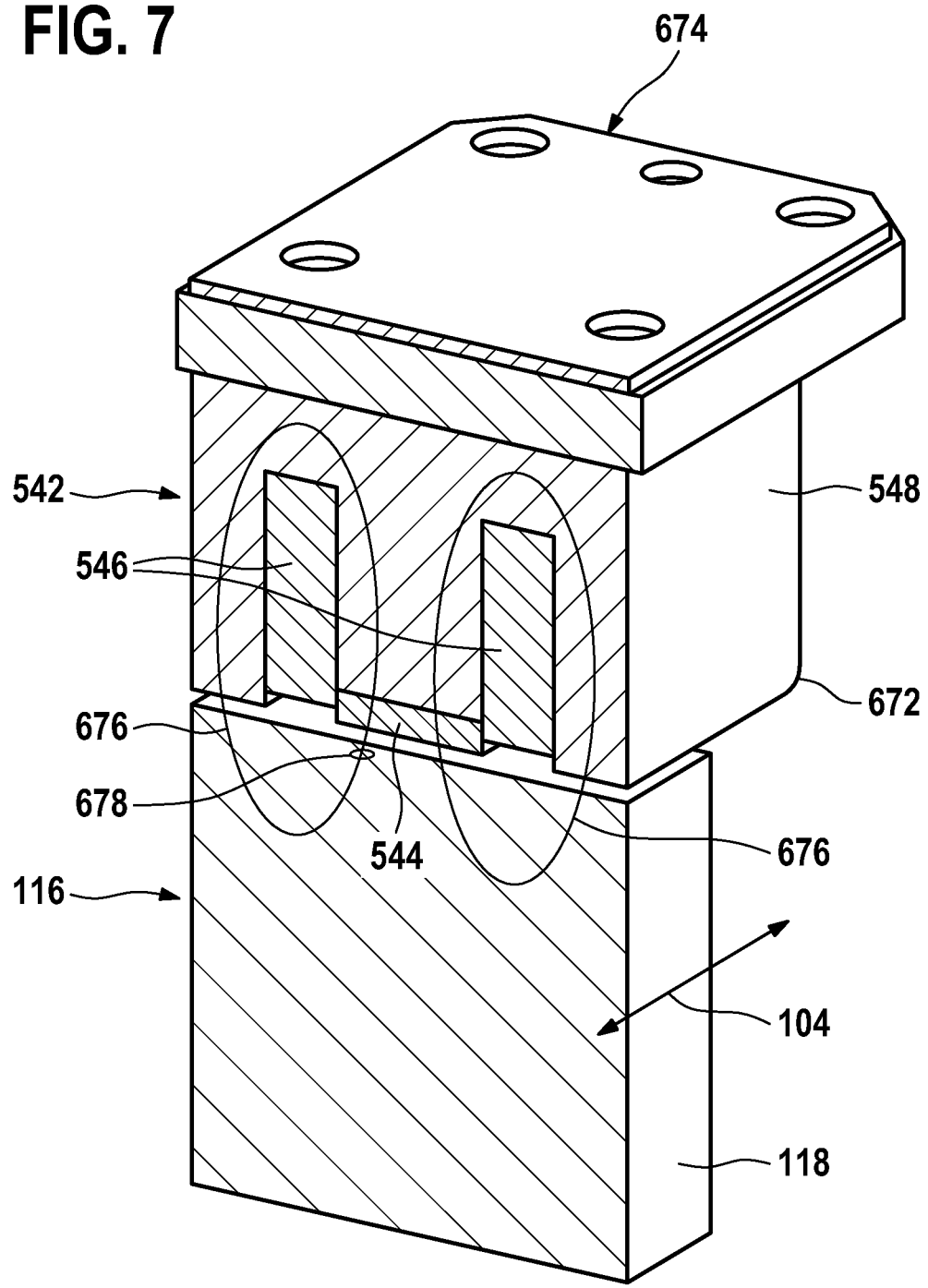
FIG. 7 shows a cross sectional view of a hybrid magnet and a cylindrical rotor according to an embodiment of the invention.

FIG. 7 shows a cross-sectional diagram which shows an example of a hybrid magnet in operation. There is a hybrid magnet 542 and a cylindrical rotor 116. Hybrid magnet 542 comprises the previously described hybrid magnet and a hybrid magnet mount 674. The cylindrical rotor 116 comprises a ferromagnetic material 118. The permanent magnet 544 is adjacent to the ferromagnetic material 118. In this diagram we see magnetic field lines 676 due to the coils 546. Electromagnets 546 serve to strengthen and weaken the permanent magnet 544. Curve 678 shows the path of a small eddy current induced by magnetic field line 676.

Figure 8:
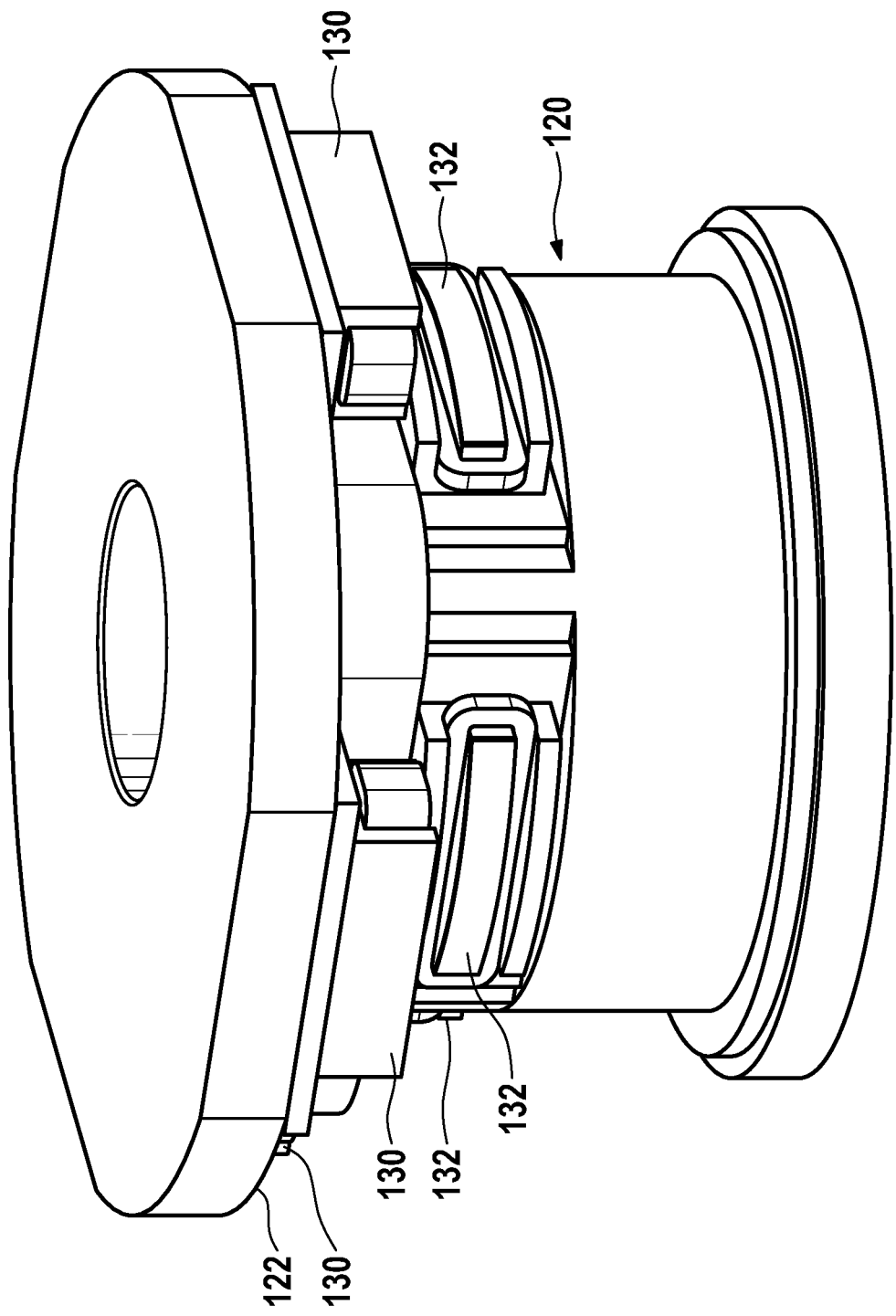
FIG. 8 shows a perspective view of a magnetic bearing according to an embodiment of the invention with the cylindrical rotor removed.

FIG. 8 shows an embodiment of a static hub 120 according to an embodiment of the invention. The static hub 120 has an overhang 122. There is a lift magnetic actuator apparatus 130 mounted to the underside of the overhang 122 and there is a radial magnetic actuator apparatus 132 mounted below the overhang 122 on the static hub 120.

Figure 9:
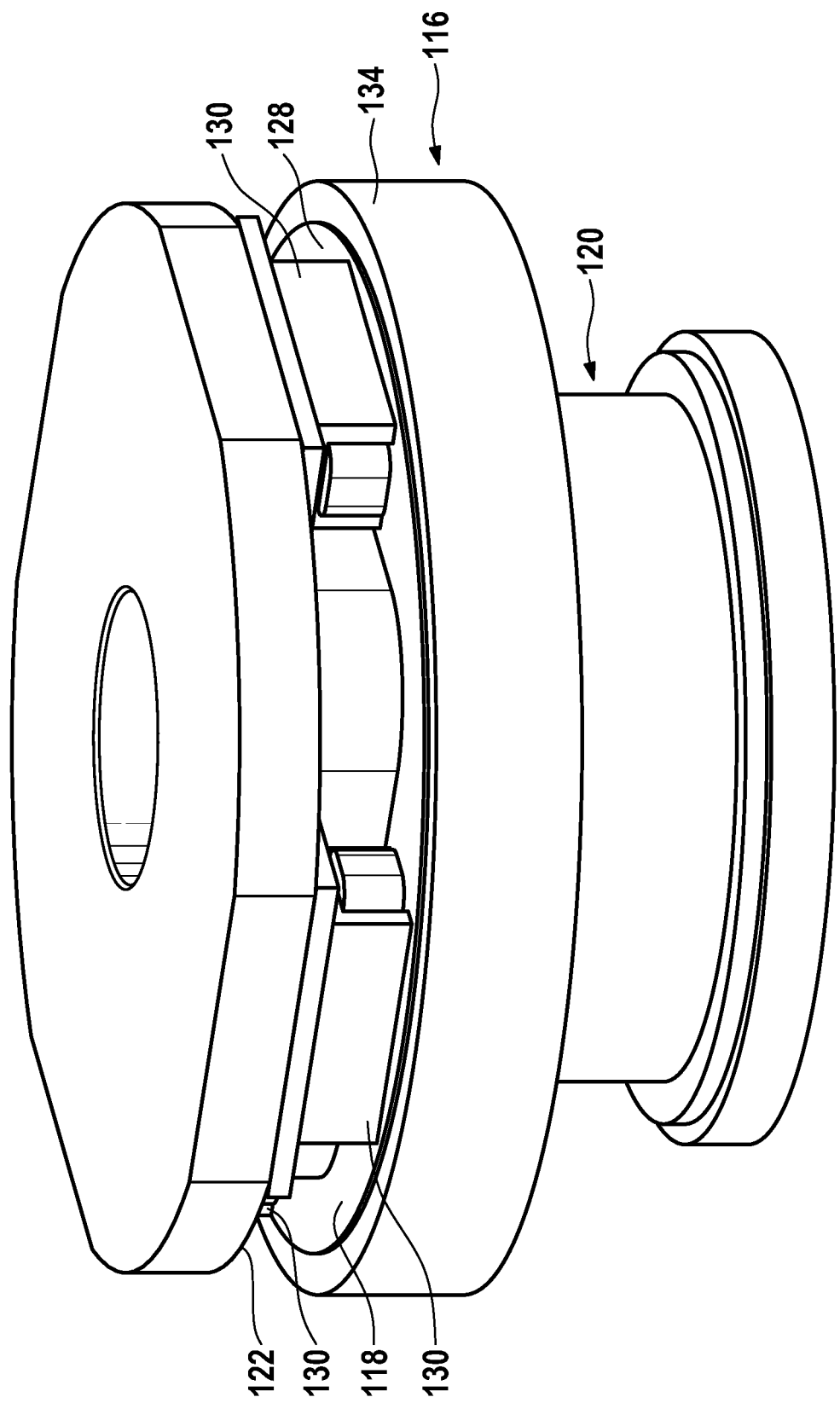
FIG. 9 shows a perspective view of a magnetic bearing according to an embodiment of the invention.

FIG. 9 shows an assembly drawing of a magnetic bearing according to an embodiment of the invention. There is a static hub 120 with the cylindrical rotor 116 mounted on it. The cylindrical rotor comprises the metal 134 on the outside, and on the inside is a ferromagnetic material 118. Also visible is the lift magnetic actuator apparatus 130. The lift magnetic actuator apparatus 130 is between the overhang 122 and the topside 128 of the cylindrical rotor 116.

In FIG. 8 and FIG. 9, the considered way of rotational magnetic levitation is shown. The cylindrical rotor 116 shown in FIG. 9 is connected to the rotational part of the system. This disk can be connected to the rotor of an electric motor as well.

The lift 130 and radial 132 magnetic actuators apparatus are indicated in FIGS. 8 and 9. The lift 130 and radial 132 magnetic actuators comprise an E-shaped core, a permanent magnet (to create offset field or preload) and a coil. In this case it is a reluctance actuator. Another sort of actuator can also be used in another embodiment.

The permanent magnet field generated by the lift magnetic actuators apparatus 130 can attracts the rotating load in vertical direction against gravity. The coils control the gap variations thus the stability of the system.

In FIG. 8, the radial actuator apparatus is shown. It creates a certain preload due to permanent magnets. This preload can be weaker than the preload of radial units.

Figure 10:
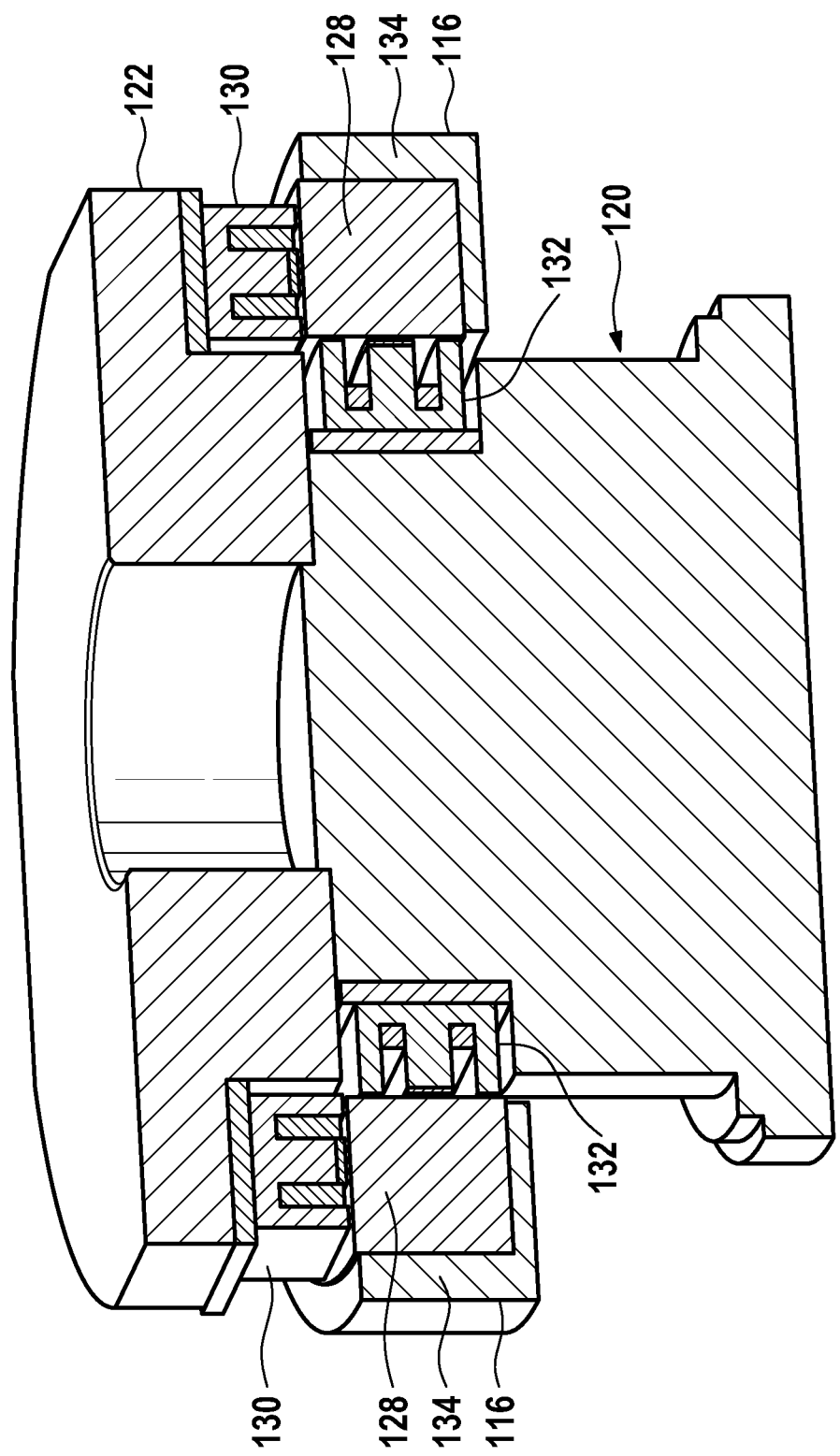
FIG. 10 shows a cross sectional, perspective view of a magnetic bearing according to an embodiment of the invention.

FIG. 10 shows a cross sectional, perspective view of the magnetic bearing shown in FIGS. 9 and 10. At higher speeds, fast changing magnetic fields induce eddy currents in the steel. Eddy currents create losses and a damping force that is opposing the rotation. The steel rotational disk is clearly exposed to variable magnetic fields in both radial and axial directions. In order to remove (minimize) this effect, the steel could be made of a soft magnetic composite iron. An example of a soft magnetic composite is Somaloy. In FIG. 10, the cross-sectional view of the part of the disk in orange color which should comprise a low loss (low electrical resistance) material.

Figure 11:
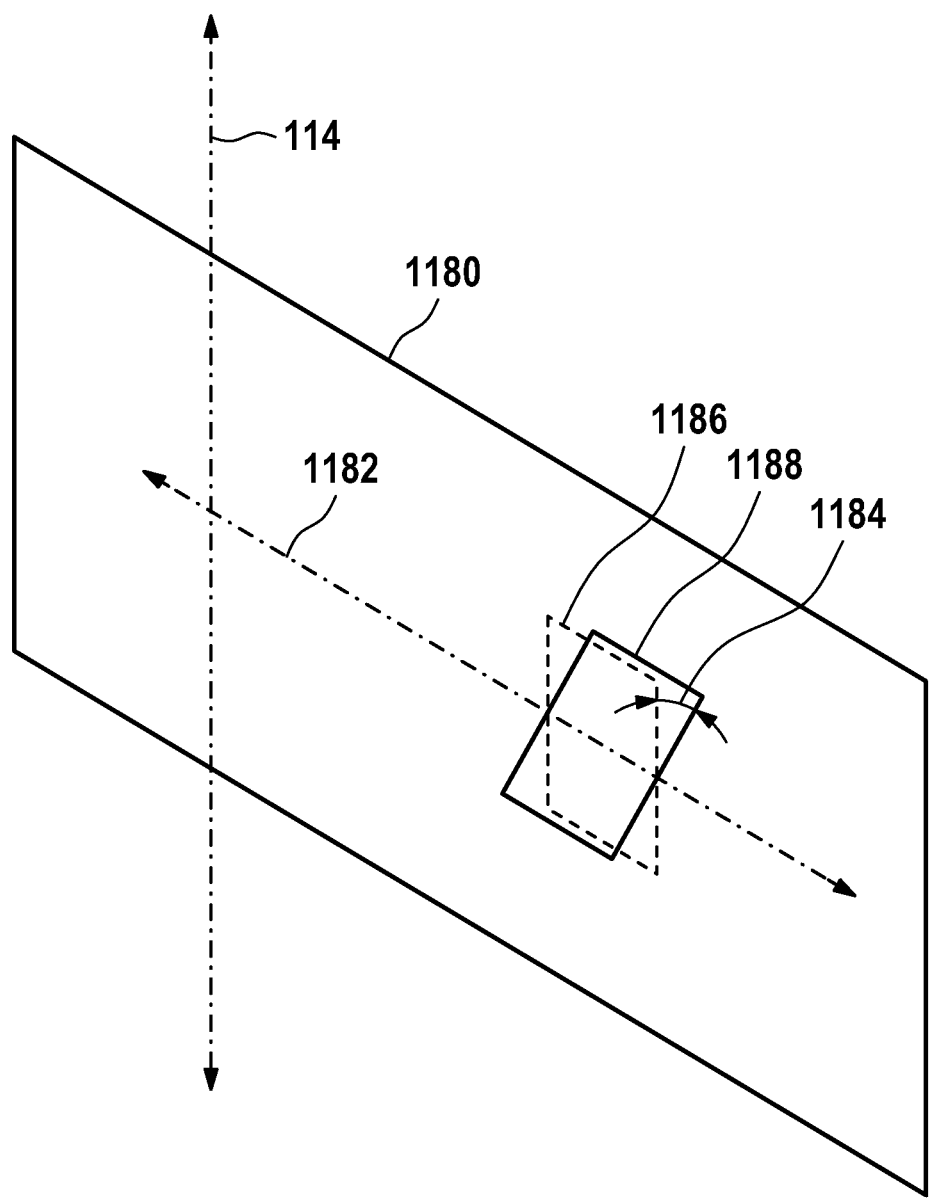
FIG. 11 illustrates the rotation of a ferromagnetic lamination about its first transversal axis.

FIG. 11 is used to illustrate how the position of laminations when they have been rotated about their first transversal axis 1182. FIG. 11 shows the axis of symmetry 114 of a cylindrical rotor. There is a plane 1180 in which the axis of symmetry 114 lies. A plane 1180 can be drawn for each lamination 1188. The position of the lamination before rotation is marked by dashed lines labeled 1186. The lamination 1188 has a first transversal axis 1182. The first transversal axis 1182 also lies in the plane 1180. The first transversal axis 1182 is also perpendicular to the axis of symmetry 114. The lamination is rotated about the first transversal axis 1182 by a first angle 1184.

Figure 12:
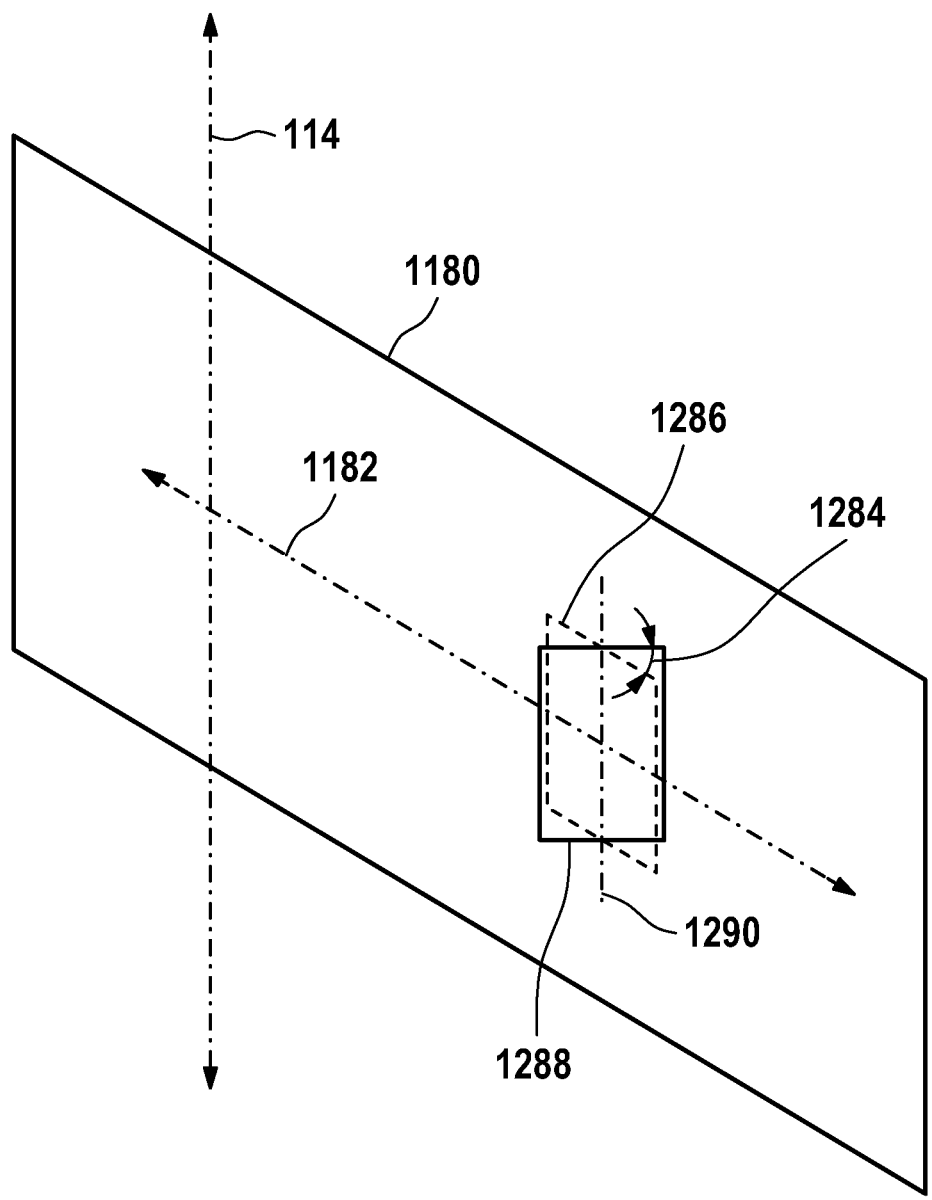
FIG. 12 illustrates the rotation of a ferromagnetic lamination about its first longitudinal axis.

FIG. 12 illustrates the rotation of a ferromagnetic lamination 118 about its first longitudinal axis 1290. In FIG. 11 we can see the axis of symmetry 114 that lies in the plane 1180. In this Figure, the ferromagnetic lamination 1288 is rotated from its position in the plane 1286 by a second angle 1284. The first longitudinal axis 1290 lies in the plane 1180 and is in the same direction but is not coaxial with the axis of symmetry 114. This means it is also perpendicular to the first transversal axis 1182. The orientation of the laminations can be specified by rotation about the first angle 1184 and the second angle 1284 as illustrated in FIGS. 10 and 11.

Figure 13:
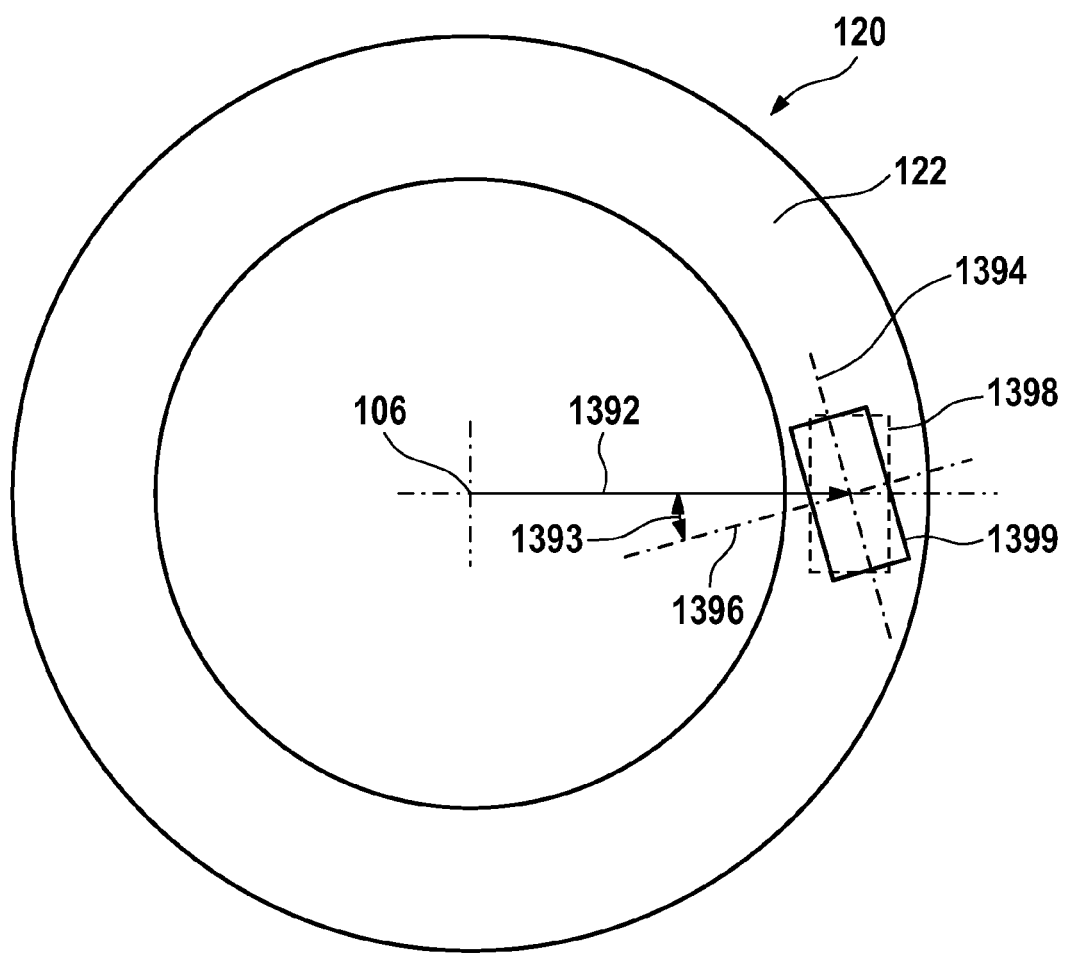
FIG. 13 illustrates the rotation of a hybrid magnet on the static hub.

FIG. 13 shows the orientation of a hybrid magnet 1399 after it has been rotated and put at a skew angle on the static hub 120. FIG. 13 shows a bottom view of a static hub 120. A hybrid magnet 1399 is shown mounted on the overhang 122. The position before rotation is shown in dashed lines as 1398. The hybrid magnet 1399 has a second longitudinal axis 1394 and a second transversal axis 1396. Since this is a bottom view the position of the axis of rotation 106 is shown as a point 106. There is a radius extending from the vertical axis of rotation 106 to the intersection point of the second longitudinal axis 1394 and the second transversal axis 1396. After rotation the second transversal axis 1396 and the radius 1392 enclose a third angle 1393.

Figure 14:
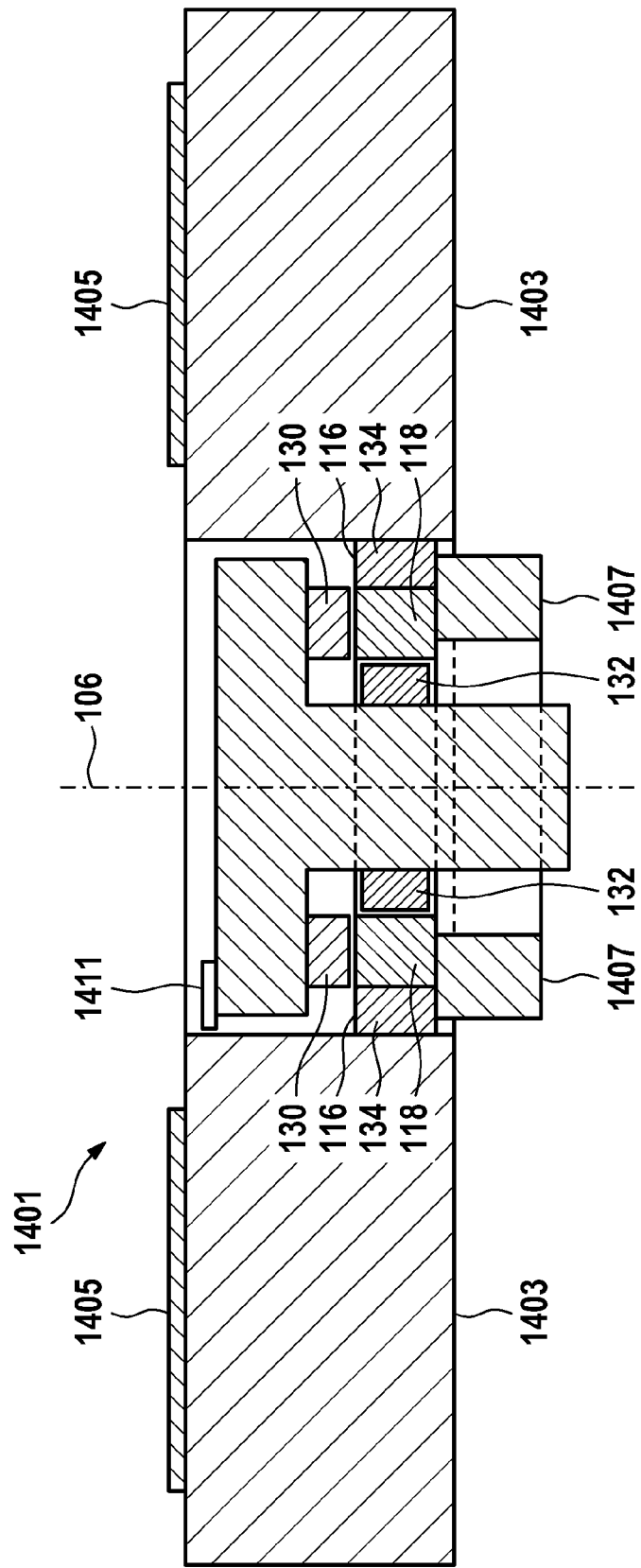
FIG. 14 shows an embodiment of a rotary stage according to the invention.

FIG. 14 shows an embodiment of a rotary stage 1401 according to the invention. The rotary stage shown in FIG. 13 incorporates a magnetic bearing as was previously shown in FIG. 2. There is a platter 1403 shown mounted to the cylindrical rotor 116. To turn the magnetic bearing there is a motor 1407. This can be a mechanical drive system or it can also be a magnetic rotor. There is an encoder 1411 to accurately measure the rotational position of the platter 1403. On top of the platter 1403 are shown two substrates 1405. Examples of substrates 1405 would be silicon wafers or masks for semiconductor fabrication.

LIST OF REFERENCE NUMERALS

100 Perspective view of rotational disk
102 Side view of rotational disk
104 Direction of rotation
106 axis of rotation
108 Magnetic bearing
110 Stabilization due to lift magnetic actuator apparatus
112 Stabilization due to radial magnetic actuator apparatus
114 Axis of symmetry
116 Cylindrical rotor 118 Ferromagnetic material
120 Static hub
122 Overhang
124 Inner radius
126 Distance between top side and overhang
128 Top side
130 Lift magnetic actuator apparatus
132 Radial magnetic actuator apparatus
134 Collar
136 Distance between inner radius and the axis of rotation
338 Ferromagnetic lamination
440 Ferromagnetic laminations
542 Hybrid magnet
544 Permanent magnet
546 Coil
548 Ferromagnetic core
550 Slot
552 Middle section
554 Outer surface
556 Normal to outer surface
662 Current
664 Force of attraction as a function of current due to electromagnet
666 Force necessary to lift cylindrical rotor
668 Nominal current that can be replaced by permanent magnet
670 Change in force necessary to control cylindrical rotor
672 Rounded edge
674 Mount for hybrid magnet
676 Magnetic field line
678 Eddy current
1180 Plane
1182 First transversal axis
1184 First angle
1186 Location of ferromagnetic lamination before rotation about first transversal axis
1188 Ferromagnetic lamination
1284 Second angle
1286 Location of ferromagnetic lamination before rotation about first longitudinal axis
1288 Ferromagnetic lamination
1290 First longitudinal axis
1392 radius
1393 Third angle
1394 Second longitudinal axis
1396 Second transversal axis
1398 Original orientation of hybrid magnet
1399 Hybrid magnet
1401 Rotary stage
1403 Platter
1405 substrate
1407 motor
1411 encoder

The invention claimed is:

1. A magnetic bearing with an axis of rotation, wherein the magnetic bearing comprises:
a cylindrical rotor comprising a ferromagnetic material, wherein the cylindrical rotor has an axis of symmetry, wherein the cylindrical rotor has an inner radius, wherein the cylindrical rotor has a top side that lies in a plane orthogonal to the axis of symmetry,
a static hub, wherein the static hub has an overhang which protrudes from the static hub and is located adjacent to the top side,
a lift magnetic actuator apparatus for controlling the distance between the top side and the overhang, a radial magnetic actuator apparatus for controlling the distance between the inner radius and the axis of rotation; wherein the lift magnetic actuator apparatus comprises at least one permanent magnet capable of supporting the cylindrical rotor against the gravitational force and wherein the radial magnetic actuator apparatus and/or the lift magnetic actuator apparatus comprises at least one hybrid magnet, wherein the a hybrid magnet comprises:
a ferromagnetic core, wherein the ferromagnetic core has two slots cut in is the ferromagnetic core such that its cross section is E-shaped, wherein there is a middle section between the two slots, wherein the middle section has an outer surface whose normal points away from the ferromagnetic core,
a coil of wire adapted for generating a magnetic field when a current is passed through the wire, wherein the coil is located within the two slots and around the middle section, and
a permanent magnet placed on the outer surface, wherein the magnetization is aligned with the normal of the outer surface.

2. The magnetic bearing of claim 1, wherein the ferromagnetic material comprises one of the following in order to reduce eddy currents during rotation of the cylindrical rotor: a soft magnetic composite and Somaloy.

3. The magnetic bearing of claim 1, wherein the ferromagnetic material comprises ferromagnetic laminations for reducing eddy currents during rotation of the cylindrical rotor, and wherein the laminations are stacked in a circular path about the axis of symmetry to construct a cylindrical volume.

4. The magnetic bearing of claim 3, wherein there is a plane in which the axis of symmetry lies for each of the laminations, wherein each of the laminations has a first transverse axis, and wherein each of the laminations is arranged such that it is rotated out of the plane about its first transverse axis by a first angle between 0 and 60 degrees.

5. The magnetic bearing of claim 4, wherein the first angle is between 0.1 and 15 degrees.

6. The magnetic bearing of claim 3, wherein there is a plane in which the axis of symmetry lies for each of the laminations, wherein each of the laminations has a first longitudinal axis, and wherein each of the laminations is arranged such that it is rotated out of the plane about its first longitudinal axis by a second angle between 0 and 60 degrees.

7. The magnetic bearing of claim 6, wherein the second angle is between 0.1 and 15 degrees.

8. The magnetic bearing of claim 3, wherein the lift actuator apparatus comprises at least one first hybrid magnet, wherein the first hybrid magnet has a second longitudinal axis and a second transverse axis, wherein there is a first radius that intersects the second longitudinal axis and the second transverse axis, and wherein the second transverse axis and the radius encloses a third angle between 0 and 60 degrees with the radius and/or wherein the lift radial apparatus comprises at least one second hybrid magnet, wherein the longitudinal axis and a plane orthogonal to the axis of rotation enclose a fourth angle between 0 and 60 degrees with the radius.

9. The magnetic bearing of claim 8, wherein the third angle is between 0.1 and 15 degrees.

10. The magnetic bearing of claim 8, wherein the fourth angle is between 0.1 and 15 degrees.

11. The magnetic bearing of claim 3, wherein the lift magnetic actuator apparatus and/or radial magnetic actuator apparatus comprises at least one ferromagnetic core, wherein the ferromagnetic core has two or more second surfaces whose normal forms an acute angle with a tangent of a circular path about the axis of rotation, and wherein at least one edge of at least one second surface is rounded to reduce lamination noise.

12. The magnetic bearing of claim 1, wherein the magnetic bearing further comprises a radial sensors system for measuring the distance of the inner radius with respect to the rotational axis, wherein the magnetic bearing further comprises a lift sensors system for measuring the distance between the top side and the overhang, wherein the magnetic bearing further comprises a control system adapted for receiving signals from the lift sensor system and for controlling the lift magnetic actuator apparatus such that a first predetermined distance between the top side and the overhang is maintained, and wherein the control system is further adapted for receiving signals from the radial sensor system and for controlling the radial magnetic actuator apparatus such that a second predetermined distance between the inner radius and the axis of rotation is maintained.

13. A rotary stage, the rotary stage comprising:
a magnetic bearing according to claim 1,
a drive system adapted for rotating the magnetic bearing,
a platter adapted for holding at least one workpiece, wherein the platter is supported by the cylindrical rotor,
an encoder for determining the angular orientation of the magnetic bearing.

14. The rotary stage of claim 13, wherein the lift magnetic actuator apparatus comprises at least one permanent magnet capable of supporting the cylindrical rotor and the platter against the gravitational force.

15. A reflective electron beam lithography apparatus comprising a rotary stage according to claim 13, and wherein the workpiece is a substrate.

16. The magnetic bearing of claim 1, wherein:
the cylindrical rotor comprises an outer collar and an inner cylinder of laminated ferromagnetic material;
the inner radius of the cylindrical rotor is at the inside edge of the ferromagnetic material;
the top side is the top side of the ferromagnetic material;
the radial magnetic actuator is mounted below the overhang in the static hub and adjacent to the inside edge of the ferromagnetic material; and
the lift actuator is adjacent to the ferromagnetic material.

* * * * *